(12) United States Patent
Hoffmann et al.

(10) Patent No.: US 7,990,028 B2
(45) Date of Patent: Aug. 2, 2011

(54) TRANSFORMER ARRANGEMENT WITH A PIEZOELECTRIC TRANSFORMER

(75) Inventors: Christian Hoffmann, Deutschlandsberg (AT); Igor Kartashev, Deutschlandsberg (AT); Patrick Schmidt-Winkel, Bad Gams (AT)

(73) Assignee: EPCOS AG, Munich (DE)

( * ) Notice: Subject to any disclaimer, the term of this patent is extended or adjusted under 35 U.S.C. 154(b) by 55 days.

(21) Appl. No.: 12/548,247

(22) Filed: Aug. 26, 2009

(65) Prior Publication Data

US 2010/0026435 A1    Feb. 4, 2010

Related U.S. Application Data

(63) Continuation of application No. PCT/EP2008/052070, filed on Feb. 20, 2008.

(30) Foreign Application Priority Data

Feb. 26, 2007    (DE) .......................... 10 2007 009 230

(51) Int. Cl.
*H01L 41/08*    (2006.01)

(52) U.S. Cl. ......... 310/348; 310/344; 310/366; 310/369

(58) Field of Classification Search ................... 310/328, 310/340, 344, 348
See application file for complete search history.

(56) References Cited

U.S. PATENT DOCUMENTS

| | | | |
|---|---|---|---|
| 3,660,699 A | | 5/1972 | Sakurai et al. |
| 3,683,211 A | * | 8/1972 | Perlman et al. ............... 310/326 |
| 5,118,982 A | * | 6/1992 | Inoue et al. .................. 310/366 |
| 5,329,200 A | * | 7/1994 | Zaitsu ...................... 310/316.01 |
| 5,583,829 A | | 12/1996 | Zama et al. |
| 6,114,797 A | * | 9/2000 | Bishop et al. ................ 310/318 |
| 6,346,764 B1 | * | 2/2002 | Boyd .......................... 310/366 |
| 6,617,757 B2 | * | 9/2003 | Vazquez Carazo et al. .. 310/317 |
| 6,800,985 B2 | * | 10/2004 | Baker et al. .................. 310/348 |
| 7,075,217 B2 | * | 7/2006 | Vazquez Carazo ........... 310/359 |
| 2002/0079787 A1 | | 6/2002 | Pohl et al. |

FOREIGN PATENT DOCUMENTS

| | | |
|---|---|---|
| DE | 10 2005 002 998 A1 | 8/2006 |
| DE | 10 2005 015 600 A1 | 10/2006 |
| EP | 0 898 313 A1 | 2/1999 |

* cited by examiner

*Primary Examiner* — Mark Budd
(74) *Attorney, Agent, or Firm* — Slater & Matsil, L.L.P.

(57) ABSTRACT

A transformer arrangement with a piezoelectric transformer and a carrier will be disclosed. The transformer has a body in the form of a board. The transformer operates with thickness mode vibrations. The body is rigidly connected to the carrier in at least one peripheral region in which anti-nodes of a horizontal oscillation of the body appear.

24 Claims, 14 Drawing Sheets

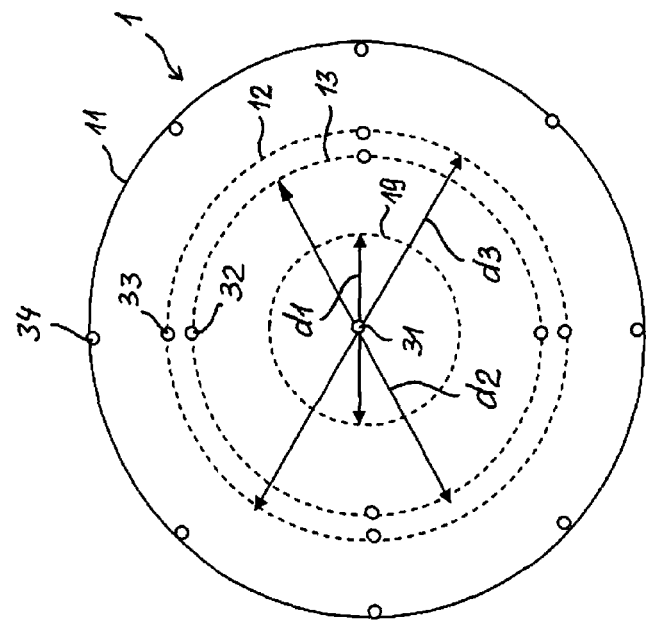
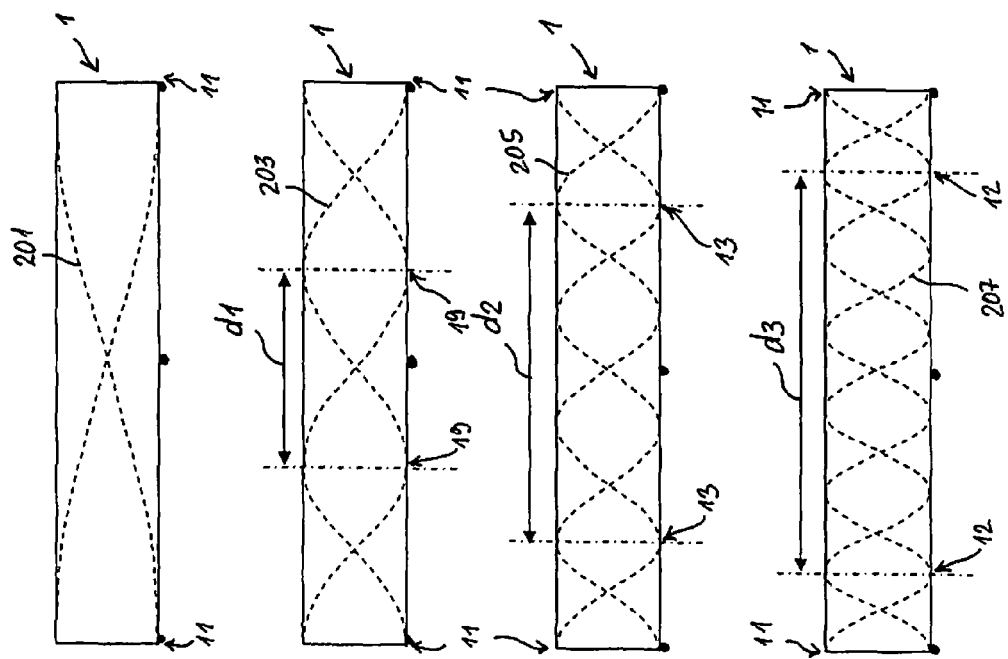

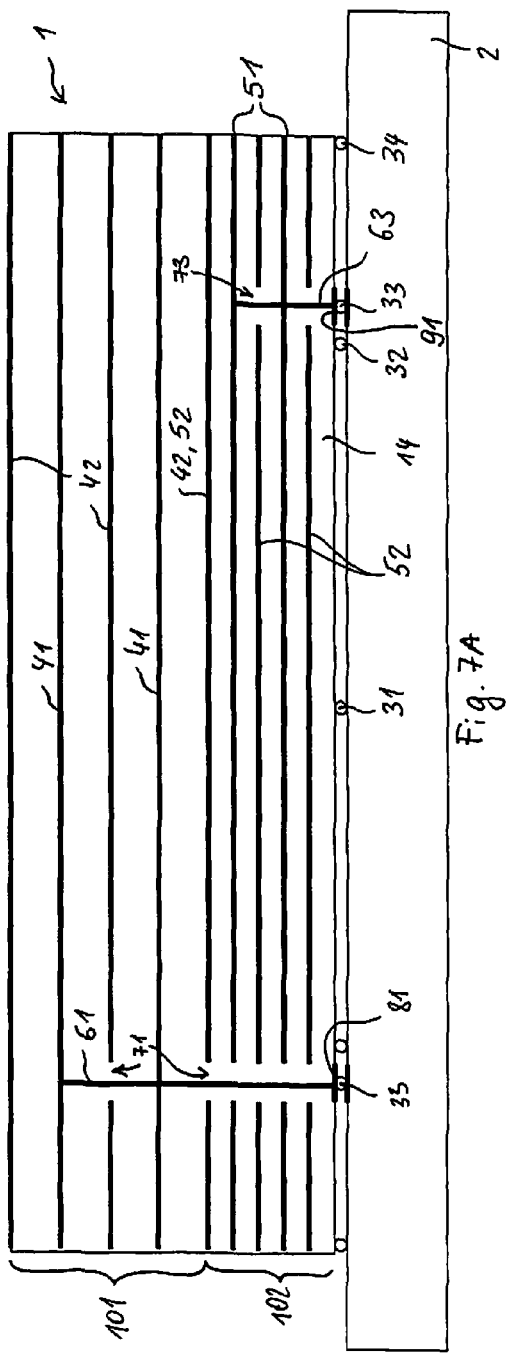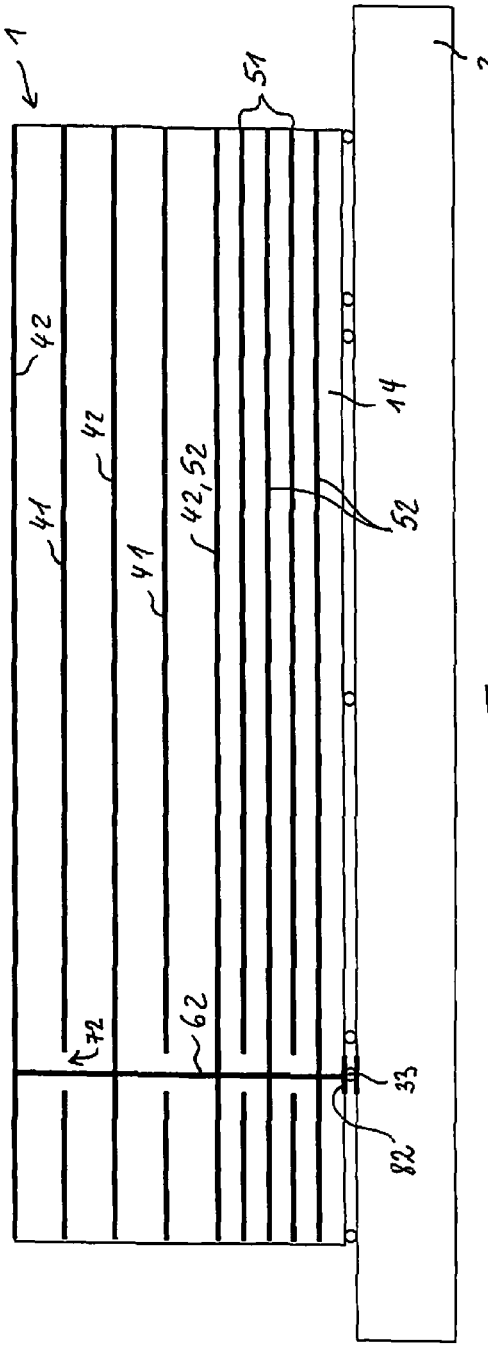

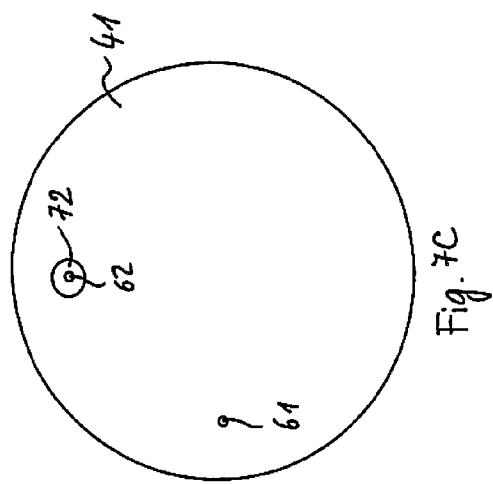
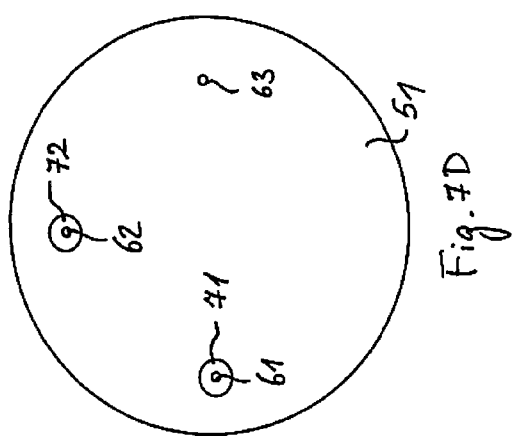
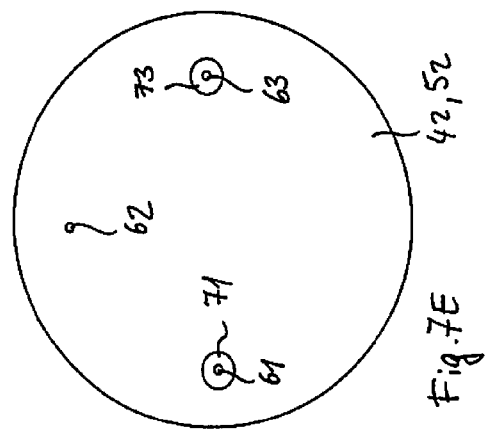

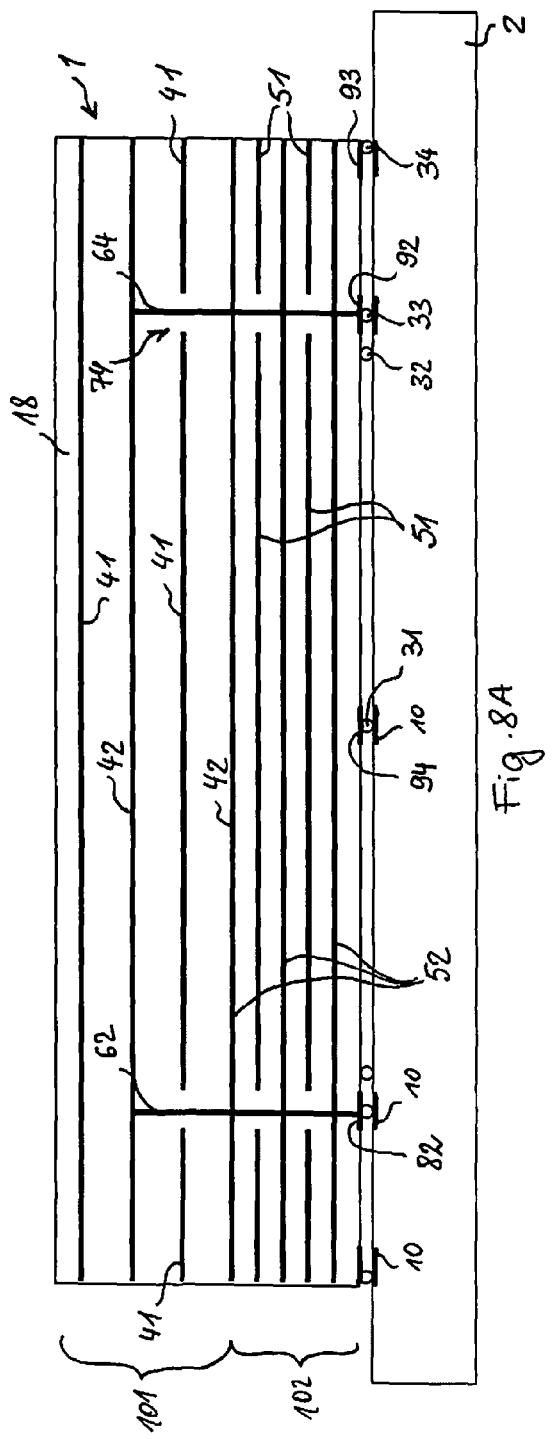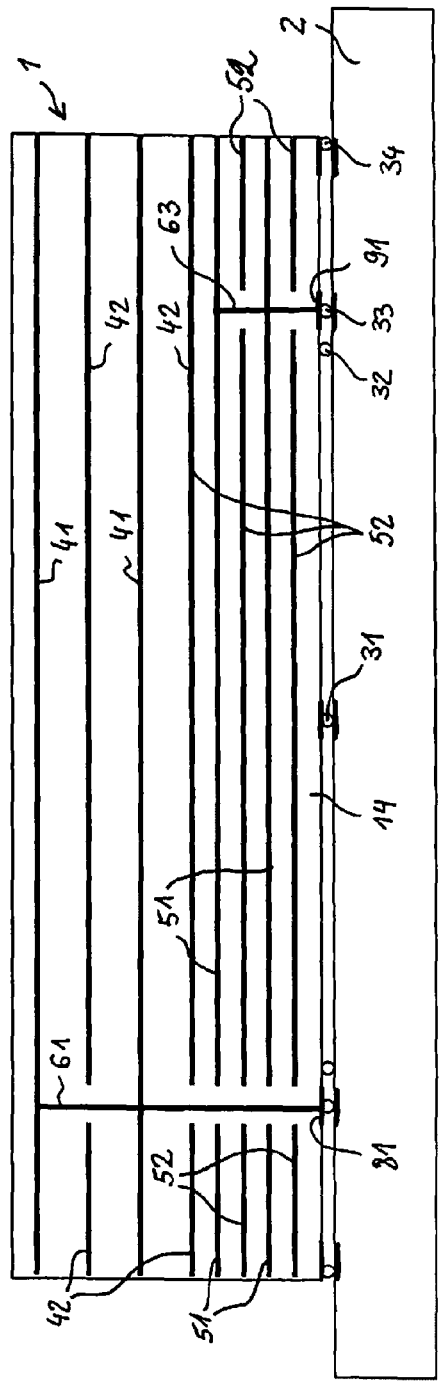

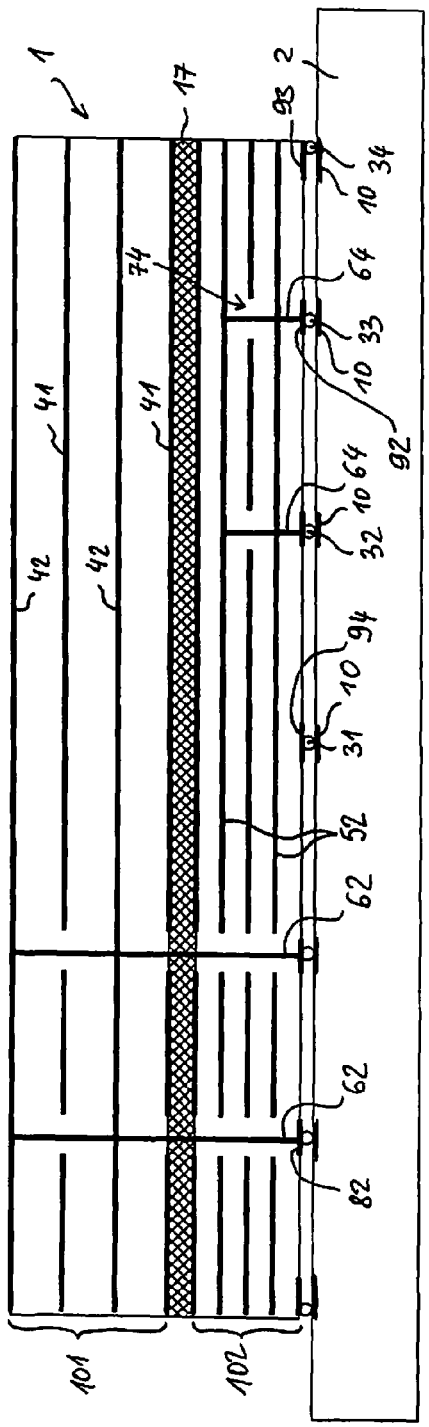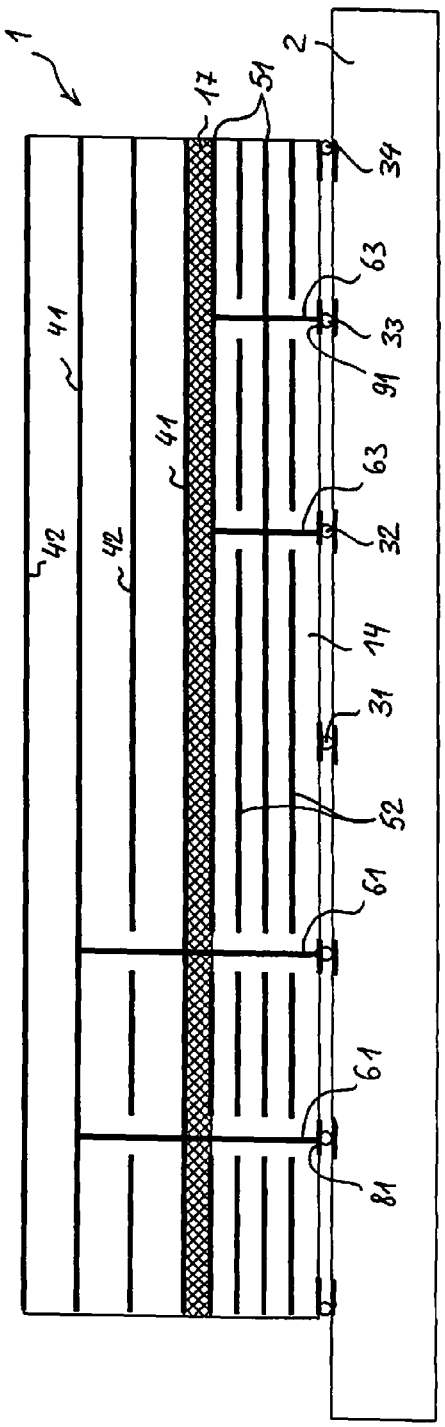

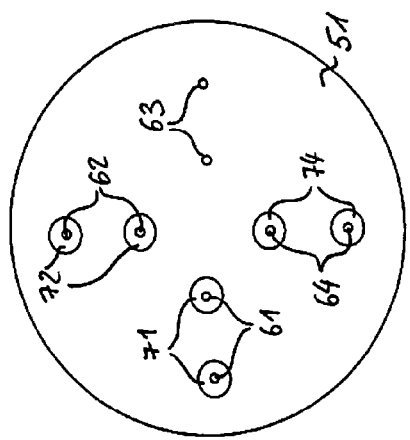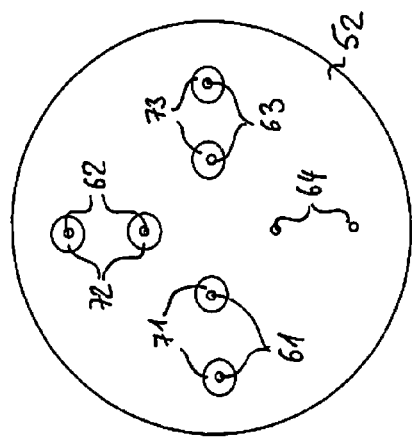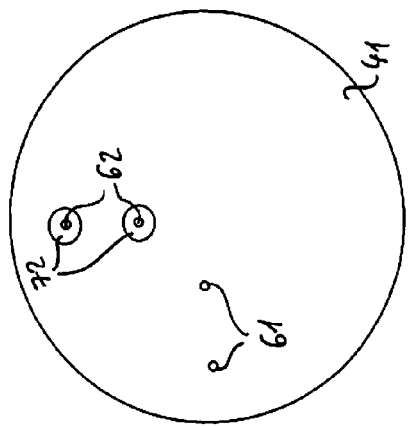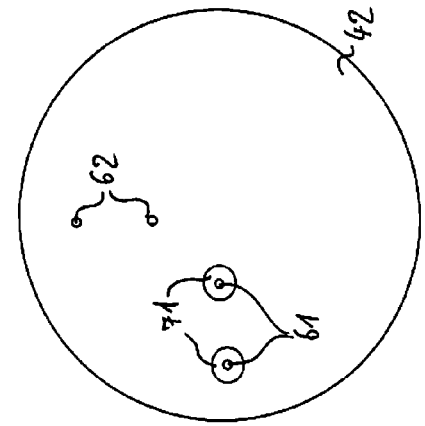

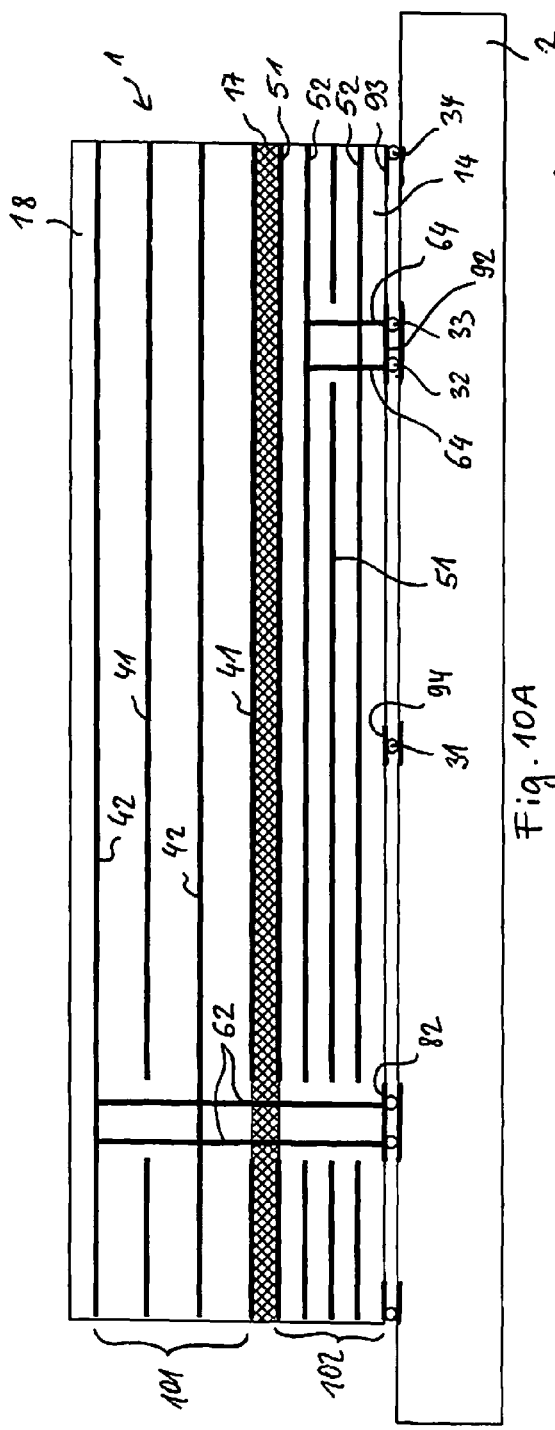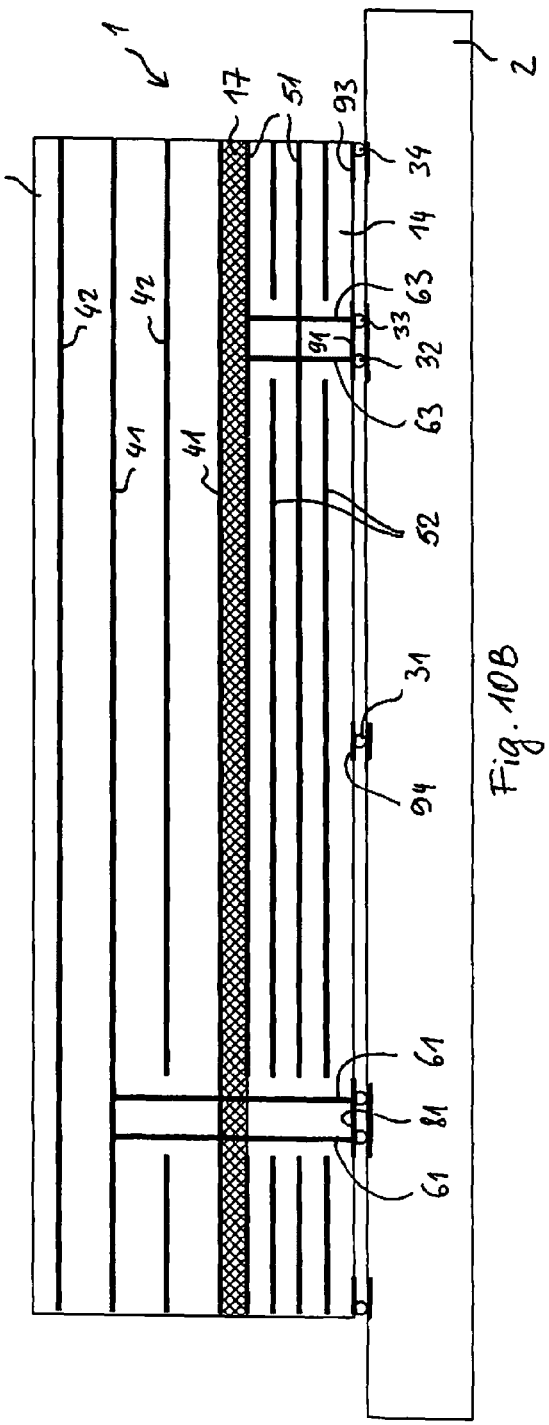
Fig. 10A
Fig. 10B

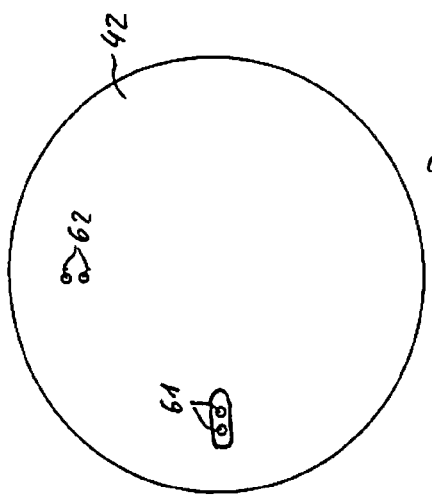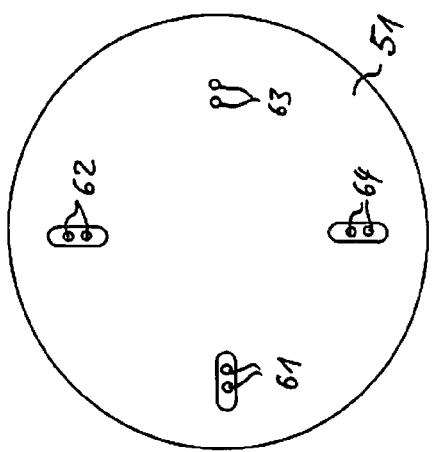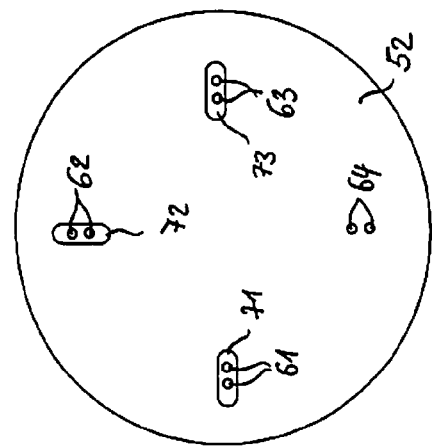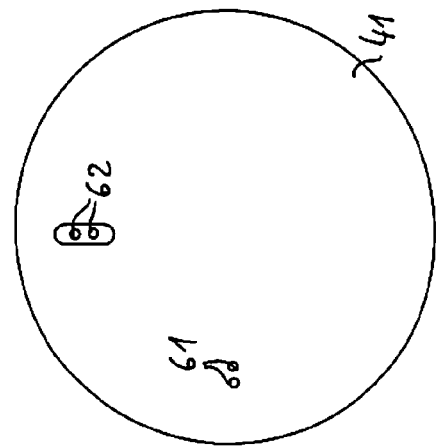

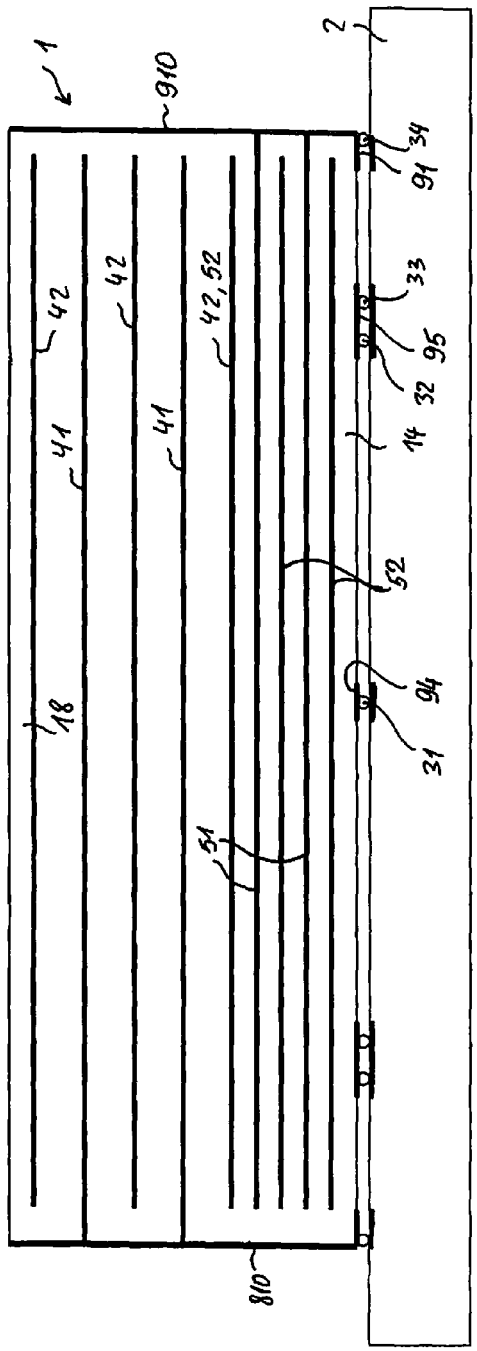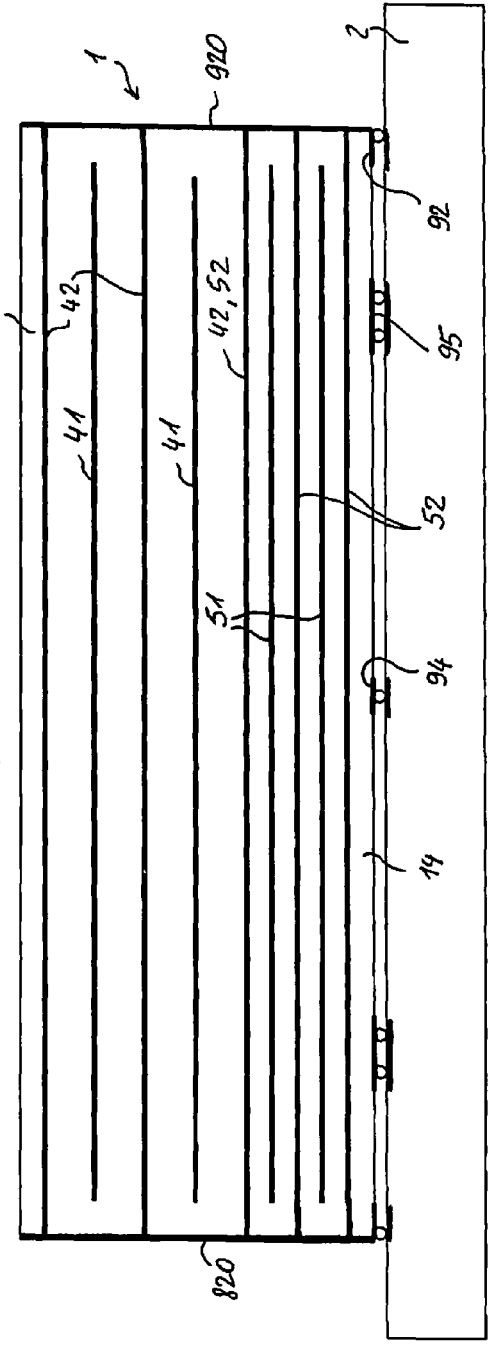
Fig. 11A
Fig. 11B ic transformer that operates with thickness mode vibrations and that is distinguished by low losses caused by parasitic vibration modes.
TRANSFORMER ARRANGEMENT WITH A PIEZOELECTRIC TRANSFORMER This application is a continuation of co-pending International Application No. PCT/EP2008/052070, filed Feb. 20, 2008, which designated the United States and was not published in English, and which claims priority to German Application No. 10 2007 009 230.1 filed Feb. 26, 2007, both of which applications are incorporated herein by reference.

BACKGROUND

A piezoelectric transformer working with thickness mode vibrations is known from U.S. Pat. No. 6,346,764 B1.

SUMMARY

In one aspect, the present invention discloses a piezoelectric transformer that operates with thickness mode vibrations and that is distinguished by low losses caused by parasitic vibration modes.

A transformer arrangement with a piezoelectric transformer and a carrier is disclosed. The transformer has a body in the form of a board that extends parallel to a primary face of the board. The transformer operates with thickness mode vibrations. The body is rigidly connected to the carrier in at least one peripheral region in which appear anti-nodes of a horizontal oscillation of the body.

The anti-nodes appear in the regions in which occur the minimum mechanical stress and the maximum oscillation amplitude. The nodes appear in the regions in which occur the maximum mechanical stress and the minimum oscillation amplitude.

By means of the mismatch of the acoustic resistance intentionally realized in the disclosed transformer arrangement for the corresponding parasitic horizontal oscillation mode, it is possible to selectively suppress this mode.

The body deflects when a voltage is applied to the input part of the transformer. Deflection is understood to be a contraction or dilatation of the body. In principle, thickness mode vibrations, horizontal oscillations, and flexural oscillations could occur. For thickness mode vibrations, a vertical deflection of the body occurs. For horizontal oscillations, a deflection of the body in the radial direction occurs. Therefore, they are also called radial oscillations.

The piezoelectric transformer is preferably designed for high-frequency applications. Because the thickness of the board is significantly smaller than its length, the frequency of the fundamental oscillation for thickness mode vibrations is higher than that of the fundamental oscillation for horizontal oscillations. A higher harmonic of the horizontal fundamental oscillation, e.g., the fifth, seventh, ninth, or eleventh harmonic, could lie at approximately the frequency of the useful thickness mode vibration. This harmonic of the horizontal fundamental oscillation represents a parasitic oscillation mode that could be selectively damped by the disclosed fixing of the body to the carrier.

The body has piezoelectric layers and electrodes. Preferably, piezoelectric layers and electrodes are arranged one above the other in an alternating sequence. In particular, ceramic, e.g., lead zirconate titanate or other suitable ceramic materials, could be used as the material for the piezoelectric layers. In particular, lead-free materials could be used.

The board preferably comprises a flat disk. The diameter of the disk preferably equals at least five times its thickness. However, the board could also have a basic shape that is rectangular, in particular, square. Alternatively, the basic shape could be oval or polygonal. For a rectangular or polygonal basic shape, the corners are preferably cut, flattened, or rounded. The disk-shaped body will be described below without restriction to generality.

The body is rigidly connected to the carrier in connection regions. In one advantageous variant, several peripheral regions and a middle region of the primary face of the body are provided that have connection regions.

The peripheral edge region of the primary face of the body facing the carrier is rigidly connected to the carrier by means of first connection elements. The first connection elements are preferably spaced apart from each other in the peripheral direction. The first connection elements are preferably distributed uniformly in the peripheral direction.

The edge region preferably borders the edge of the primary face. The width of the edge region preferably equals a maximum of 0.5 mm, but preferably no more than 5% of the horizontal length of the board.

The body is rigidly connected to the carrier by means of second connection elements in at least one peripheral region of the primary face, wherein this peripheral region is spaced apart from the edge of the primary face and anti-nodes of the horizontal oscillation appear in this peripheral region. The second connection elements are preferably spaced apart from each other in the peripheral direction. They are preferably distributed uniformly in the peripheral direction. The width of the peripheral region of the primary face that has the second connection elements preferably equals a maximum of 0.5 mm, but preferably no more than 5% of the horizontal length of the board.

Preferably, a peripheral range is provided that is free of connection elements. This region is arranged between the edge region and the peripheral region of the primary face with the connection elements.

The middle region of the primary face of the body facing the carrier is rigidly connected to the carrier preferably by means of at least one third connection element. The linear cross-sectional size of the connection element located in the middle region of the primary face preferably equals a maximum of 0.5 mm.

Preferably, an additional peripheral region is provided that is free of connection elements. This region is arranged between the middle region and the peripheral region of the primary face with the connection elements.

The sum of the faces of the connection regions between the carrier and the body preferably equals a maximum of 10%, and in one variant a maximum of 5%, of the primary face of the body. In this way, it is possible to achieve good mechanical decoupling between the transformer and the carrier. This is advantageous for avoiding losses in the operating mode of the transformer. The operating mode is preferably identical to the first harmonic of the thickness mode vibration. Alternatively, a higher, e.g., the third, harmonic of the thickness mode vibration could be provided as the operating mode of the transformer.

Preferably, for efficient suppression of the horizontal oscillation, at least eight first connection elements are provided. Preferably, at least four second connection elements are provided.

Preferably, in the appropriate radial direction, two connection elements are arranged at the same distance from the center of the primary face. These connection elements form a pair. In a selected radial direction, more than one pair of connection elements could be arranged. A symmetric arrangement of connection elements is preferred.

Maximum deflections due to flexural oscillations would occur in a non-fixed middle region of the body. By fixing the middle region to the carrier, it is possible to damp flexural oscillations of the body. By fixing the body in the peripheral region arranged between the edge region and the middle region, the flexural oscillations could also be damped.

The piezoelectric transformer has an input part and an output part that are arranged one above the other. In one variant, an insulation region is arranged between the input part and the output part. The insulation region is formed by an electrically insulating layer that extends in a horizontal plane parallel to the primary face of the body. The input part and the output part are connected to each other mechanically and separated from each other galvanically by the insulation region.

The input part and the output part each have at least one electrode for each polarity. There could also be at least two electrodes conductively interconnected for each polarity. In one variant, the input part and the output part each have at least one internal electrode arranged in the body.

The input part preferably has electrodes of first and second polarity in an alternating arrangement. The output part preferably has electrodes of third and fourth polarity in an alternating arrangement.

In one variant, the input part and the output part or their electrodes provided as ground electrodes are connected to a common ground.

At least one of the connection elements could be formed by a solder connection or bump. Each solder connection connects one connection face of the transformer to one electrical contact face of the carrier. The transformer is here preferably fixed to the carrier in a flip-chip arrangement. However, it is also possible to select at least a few of the connection elements from an electrically insulating, preferably, stiff, i.e., non-elastic, material.

In one embodiment, first electrodes of the input part are conductively connected to each other and to a connection face by at least one first via contact arranged in the body. Second electrodes of the input part are conductively connected to each other and to a connection face by at least one second via contact arranged in the body. First electrodes of the output part are conductively connected to each other and to a connection face by at least one third via contact arranged in the body. Second electrodes of the output part are conductively connected to each other and to a connection face by the one or more second via contacts or by at least one fourth via contact arranged in the body.

In one embodiment, first electrodes of the input part are conductively connected to each other and to a connection face by at least one first outer metallization arranged on the surface of the body. Second electrodes of the input part are conductively connected to each other and to a connection face by at least one second outer metallization arranged on the surface of the body. First electrodes of the output part are conductively connected to each other and to a connection face by at least one third outer metallization arranged on the surface of the body. Second electrodes of the output part are conductively connected to each other and to a connection face by the one or more second outer metallizations or by at least one fourth outer metallization arranged on the surface of the body.

The top side of the transformer facing away from the carrier can preferably oscillate freely.

BRIEF DESCRIPTION OF THE DRAWINGS

Below, the disclosed component and its advantageous implementations will be explained with reference to schematic figures not drawn to scale.

FIG. 1, shows various oscillation modes for board vibrations that take place in the body of a piezoelectric transformer;

FIGS. 2, 3, 4, show views of a piezoelectric transformer from below;

FIGS. 7A, 7B, show various cross sections of a transformer arrangement with a first piezoelectric transformer in which the input part and the output part have a common ground;

FIGS. 7C, 7D, 7E, show various electrode layers of the transformer arrangement according to FIGS. 7A, 7B;

FIGS. 8A, 8B, show various cross sections of a transformer arrangement with a second piezoelectric transformer in which the input part and the output part have a common ground;

FIGS. 9A, 9B, show various cross sections of a transformer arrangement with a first piezoelectric transformer in which the input part and the output part are galvanically separated from each other;

FIGS. 9C, 9D, 9E, 9F, show various electrode layers of the transformer arrangement according to FIGS. 9A, 9B;

FIGS. 10A, 10B, show various cross sections of a transformer arrangement with a second piezoelectric transformer in which the input part and the output part are galvanically separated from each other;

FIGS. 10C, 10D, 10E, 10F, show various electrode layers of the transformer arrangement according to FIGS. 10A, 10B;

FIGS. 11A, 11B, show various cross sections of a transformer arrangement with a piezoelectric transformer in which the electrodes assigned to each polarity are conductively interconnected by outer metallization;

Figure 4:
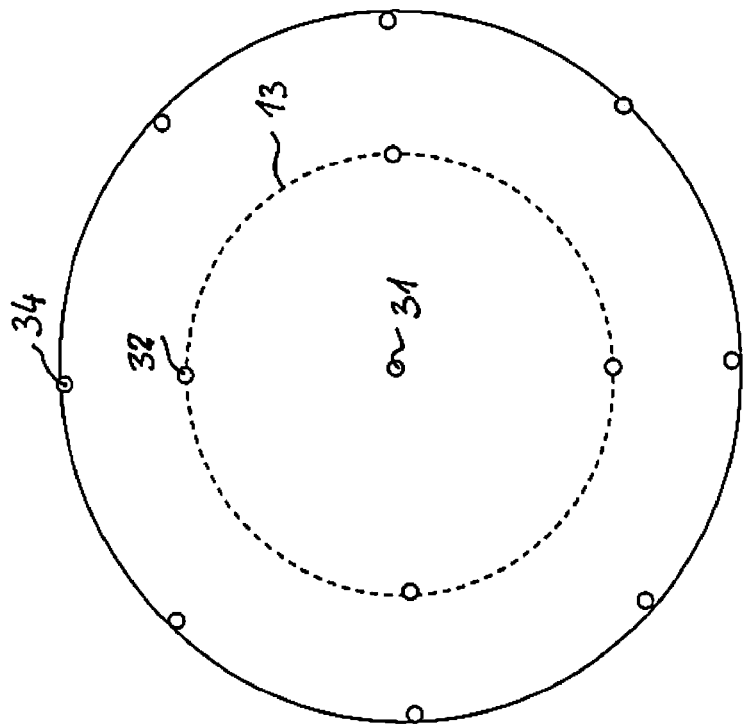

The following list of reference symbols may be used in conjunction with the drawings:

| | |
|---|---|
| d1 | Distance between anti-nodes of the third harmonic |
| d2 | Distance between anti-nodes of the fifth harmonic |
| d3 | Distance between anti-nodes of the seventh harmonic |
| 1 | Body of the piezoelectric transformer |
| 2 | Carrier |
| 10 | Contact face |
| 14 | Electrically insulating film |
| 11, 12, 13, 19 | Region in which anti-nodes of the horizontal oscillation appear |
| 17 | Electrically insulating film |
| 18 | Electrically insulating film |
| 31, 32, 33, 34, 35 | Connection elements |
| 41 | First electrodes of the input part |
| 42 | Second electrodes of the input part |
| 51 | First electrodes of the output part |
| 52 | Second electrodes of the output part |
| 61, 62, 63, 64 | Via contacts |
| 71, 72, 73, 74 | Recesses |
| 81, 81a, 82, 82a | Contact faces of the input part |
| 91, 91a, 92, 92a | Contact faces of the output part |
| 93, 94, 95, 96 | Underlay faces for the bumps |
| 101 | Input part |

-continued

| 102 | Output part |
| 201 | First harmonic of the horizontal fundamental oscillation |
| 203 | Third harmonic of the horizontal fundamental oscillation |
| 205 | Fifth harmonic of the horizontal fundamental oscillation |
| 207 | Seventh harmonic of the horizontal fundamental oscillation |
| 301, 302 | Wire |
| 810, 820, 910, 920 | Outer metallization |

DETAILED DESCRIPTION OF ILLUSTRATIVE EMBODIMENTS

In FIG. 1, a piezoelectric transformer with a body 1 working with thickness mode vibrations is shown in a cross section. In the body 1, parasitic horizontal oscillations are also excited.

In FIG. 1, the distribution of nodes and anti-nodes is indicated by dashed lines 201, 203, 205, 207, for the first, third, fifth, and seventh harmonics, respectively, of the horizontal fundamental oscillation, wherein the fundamental oscillation is designated as the first harmonic. The number of nodes or half-wavelengths within the body corresponds to the order of the harmonic. This applies analogously to the higher harmonics.

An anti-node, i.e., a maximum deflection, always occurs on side faces of the body 1, that is, also in the peripheral edge region 11 of the bottom side of the body 1. In addition, anti-nodes occur in the additional peripheral regions 12, 13, 19. Anti-nodes of the third harmonic occur in region 19, anti-nodes of the fifth harmonic occur in region 13, and anti-nodes of the seventh harmonic occur in region 12.

A region with the same oscillation phase presents a ring in a disk-shaped or cylindrical body. The diameter d1 of a region in which the anti-nodes of the third harmonic occur equals a third of the horizontal length of the body 1. The diameter d2 of a region in which the anti-nodes of the fifth harmonic occur equals ⅗ of the horizontal length of the body 1. The diameter d3 of a region in which the anti-nodes of the seventh harmonic occur equals 5/7 of the horizontal length of the body 1.

Figure 3:
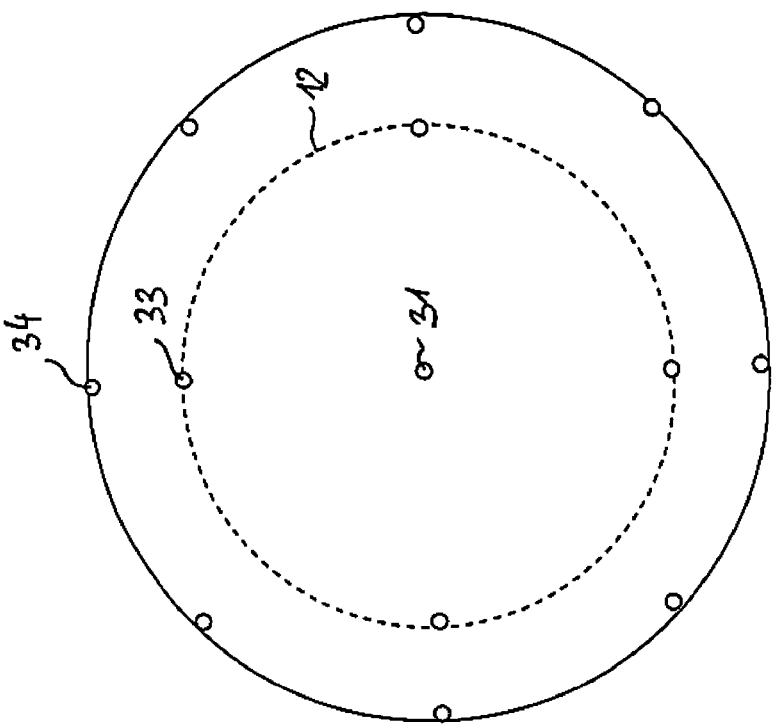

For higher modes, there are several concentric node regions that are spaced apart from each other by λ/2, as well as several concentric anti-node regions that are spaced apart from each other by λ/2, where λ is a wavelength related to the given mode. In principle, the fixing of the body on the carrier 2 (illustrated, e.g., in FIG. 7) could be realized in an arbitrary anti-node region of the oscillation mode to be damped, see FIGS. 2, 3, 4. The carrier 2 could be, e.g., an external printed-circuit board or a ceramic substrate.

For fixing the body 1, the contact face, i.e., the cross-sectional size of the connection elements is preferably selected as small as possible. The fixing could be performed, for example, essentially with a point shape.

The edge region 11 of the body is rigidly connected to the carrier 2 by at least eight first connection elements 34. In one advantageous variant, twelve or sixteen first connection elements 34 are provided that are distributed at a constant distance from each other in the peripheral direction. Preferably, at least one additional peripheral anti-node region 12, 13, 19 is connected to the carrier 2 by at least four second connection elements 33, 32, 35, see FIGS. 2, 3, 4, 5. The width of each region 11, 12, 13, 19 is small and preferably equals a maximum of 0.5 mm.

Figure 5:
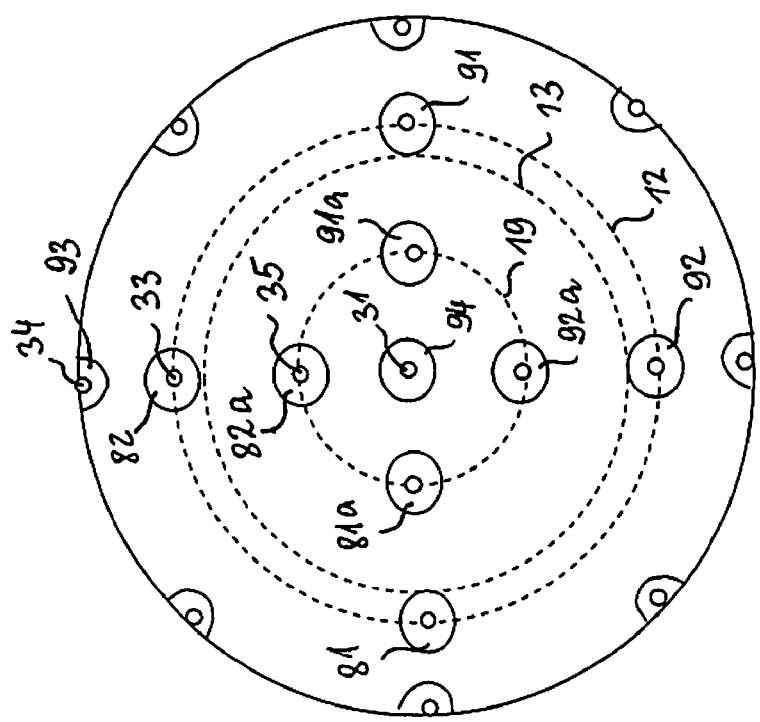
Figure 8D:
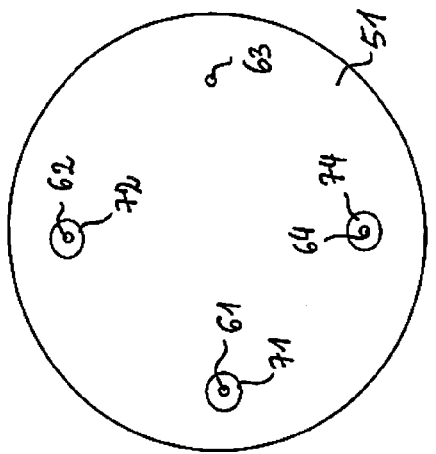
FIGS. 8C, 8D, 8E, show various electrode layers of the transformer arrangement according to FIGS. 8A, 8B.
Figure 8E:
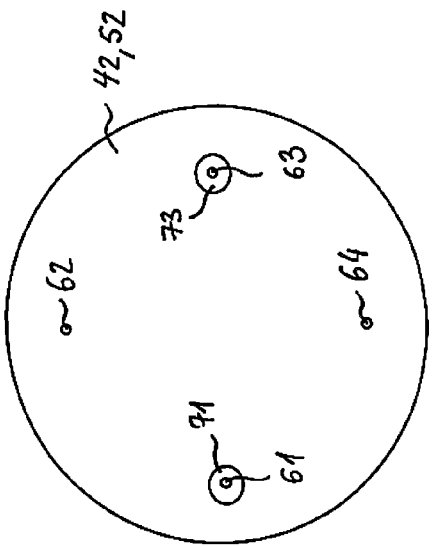
Figure 8C:
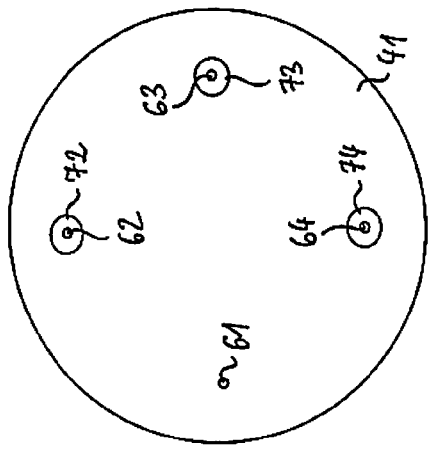
Figure 11C:
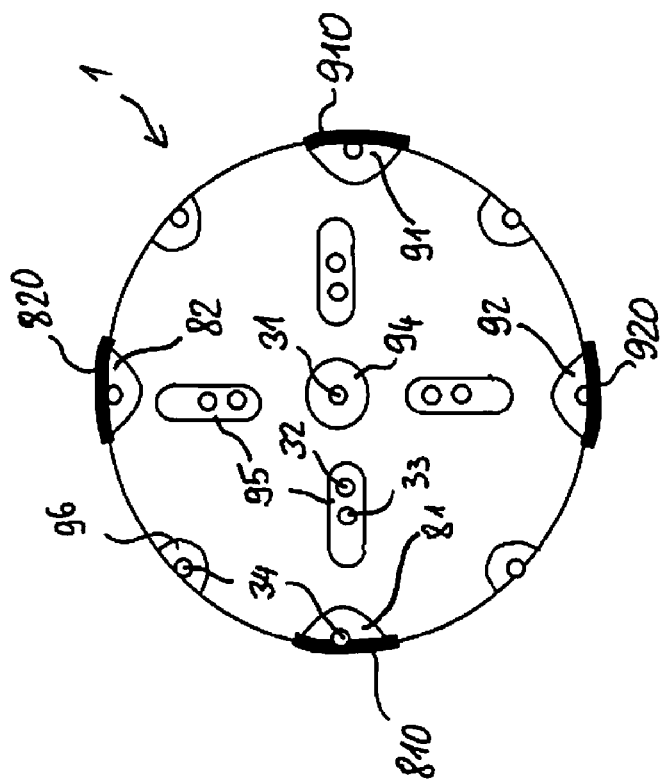
FIG. 11C, shows the view of a transformer according to FIGS. 11A, 11B from below.
Figure 11D:
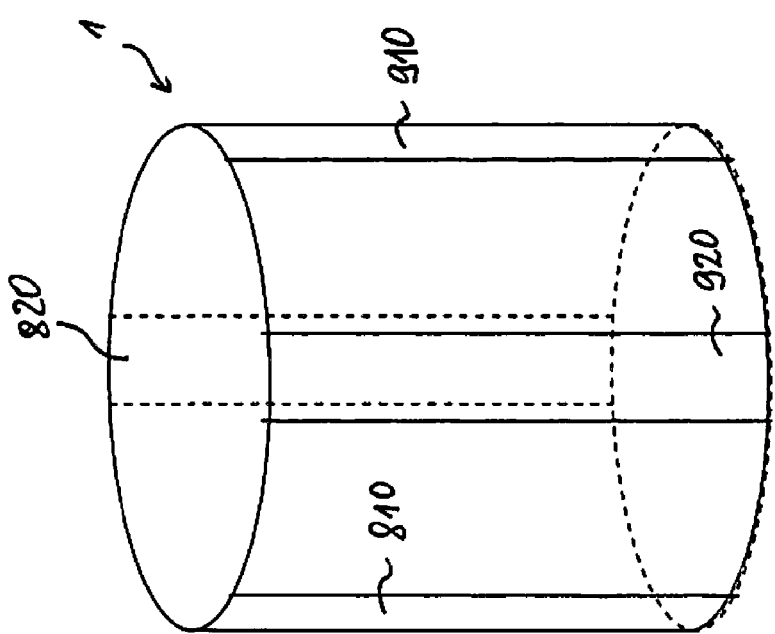
FIG. 11D, shows the transformer according to FIGS. 11A, 11B in a perspective view.

The connection elements 33 lie in the peripheral direction at a distance from each other on the line 12, the connection elements 32 on the line 13, and the connection elements 35 in FIG. 5 on the line 19.

Through the arrangement of connection elements 32 in the peripheral direction, it is possible to damp the fifth harmonic of the radial oscillation. Through the arrangement of connection elements 33 in the peripheral direction, it is possible to damp the seventh harmonic of the radial oscillation. Through the arrangement of connection elements 35 in the peripheral direction, it is possible to damp the third harmonic of the radial oscillation.

For damping the flexural oscillation of the body, the middle region of the bottom side of the body is connected to the carrier 2 by means of the fixing element 31. The fixing in the peripheral regions 12, 13, 19 that are arranged between the center and the edge region 11 is also active in the sense of damping flexural oscillations.

The connection elements that exhibit electrical conductivity could be used for the electrical contacting of the piezoelectric transformer. The connection elements could be constructed, in particular, as bumps with a linear cross-sectional size of a maximum 300 μm. The bumps connect the connection faces 81, 82, 91, 92 (see FIGS. 5, 6) of the transformer arranged on the bottom side of the body 1 to the contact faces 10 of the carrier 2.

In the body 1, one input part 101 and one output part 102 of the transformer are realized. In the variant shown, the input part 101 is arranged above the output part 102. In all of the variants, the input and output parts could also be exchanged for each other.

The connection faces 81, 82 are assigned to the input part 101, and the connection faces 91, 92 are assigned to the output part 102 of the transformer. The connection faces 82 and 92 are preferably provided for connecting to the given reference potential.

On the bottom side of the body there could also be additional conductive faces 93, 94, 95 that are provided as underlay faces or under-bump metallizations for the connection elements 31, 34, see FIGS. 7A, 8A, 9A, 10A, and 11A. At least a few of these faces, e.g., the underlay faces 93, 94, and 95, are not connected to the electrodes of the transformer.

In contrast, in the variant according to FIG. 5, the underlay faces 81a, 82a, 91a, 92a are conductively connected to the electrodes of the transformer and could be used, in principle, as additional connection faces. FIG. 5 shows the corresponding underlay face 81a, 82a, 91a, 92a spaced apart from the connection face 81, 82, 91, 92 conductively connected to it. Here, only one connection element is provided for each underlay face 81, 81a, 82, 82a, 91, 91a, 92, 92a, 93, 94.

Figure 6:
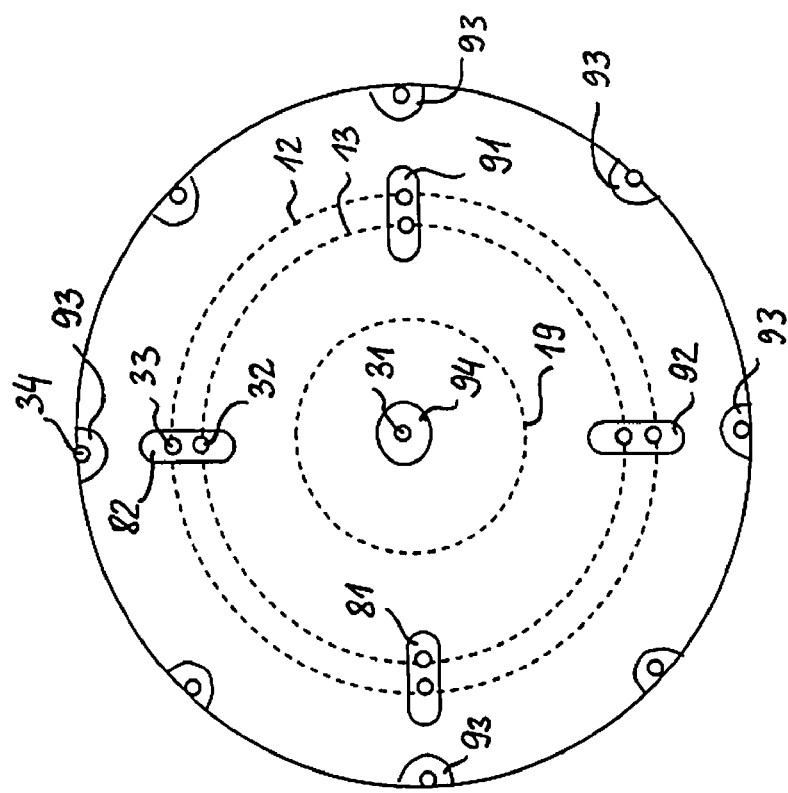
FIGS. 5, 6, show views of a piezoelectric transformer with connection elements constructed as bumps.

However, at least two connection elements could also be provided for each underlay face. In FIG. 6, these are two connection elements 32 and 33 for each underlay face 81, 82, 91, 92. FIG. 5 corresponds to the transformer arrangement shown in FIGS. 9A, 9B. FIG. 6 corresponds to the transformer arrangement shown in FIGS. 10A, 10B.

In the embodiment shown in FIGS. 7A to 7E, in the body 1 there are several first electrodes 41 and several second electrodes 42 of the input part 101, as well as several first electrodes 51 and several second electrodes 52 of the output part 102.

The first electrodes 41 of the input part are conductively interconnected by means of a first via contact 61. The second electrodes 42, 52 of the input part and the output part are conductively interconnected by means of a second via contact 62. The first electrodes 51 of the output part are conductively interconnected by means of a third via contact 63.

The via contact 61 is arranged in a recess 71 of the electrode 42, 51, 52 to be galvanically separated from this via contact. The via contact 62 is arranged in a recess 72 of the electrode 41, 51 to be galvanically separated from this via contact. The via contact 63 is arranged in a recess 73 of the electrode 52 to be galvanically separated from this via contact.

The electrodes 41, 42, 51, 52 assigned to the different polarities are arranged one above the other in the input part or output part in an alternating sequence, wherein a piezoelectric layer is arranged between two successive electrodes. An electrically insulating layer 14 is preferably arranged between the lowermost electrode of the transformer and the carrier 2. Another electrically insulating layer 18 could be arranged on the uppermost electrode of the transformer, see FIGS. 9A, 10A, 11A.

The insulating layer 14 and/or 18 could be a passivation layer made from an arbitrary dielectric material, e.g., glass, silicon dioxide, an organic coating, or a ceramic. In particular, the same material that was used for the piezoelectric layers of the body could be used for the electrically insulating layers 14, 18 on the ends. In all of the embodiments, at least one of the insulating layers 14, 18 could be eliminated. Alternatively, in all of the embodiments, both layers 14, 18 or only one of these layers, preferably, the lower layer 14, could be used.

In the variant according to FIGS. 7A-7E, only three electrical connections of the transformer are provided, because the input part 101 and the output part 102 are connected to the same ground. In this case, the connection faces, via contacts, and connection elements are preferably arranged along radial lines that form an angle of 120° to each other.

In the variants with four connection faces, the connection faces, via contacts, and connection elements are preferably arranged along radial lines that form an angle of 90° to each other.

In the variant according to FIGS. 7A-7E, the connection elements 33 are provided as bumps, while the connection elements 31, 32, and 34 have, e.g., an electrically insulating or other type of structure.

In the variant according to FIGS. 8A-8E, all of the connection elements up to the connection elements 32 are constructed as bumps. In this case, the electrodes 42, 52 of the input part and the output part, wherein these electrodes are provided as ground electrodes, are also connected to each other by a fourth via contact 64. The via contact 64 is arranged in a recess 74 of the electrodes 41, 51 to be galvanically separated from this via contact.

In the variant according to FIGS. 9A-9F and 10A-10F, the second electrodes 42 of the input part are conductively interconnected by means of two second via contacts 62, and the second electrodes 52 of the output part are connected by means of two fourth via contacts 64. Each via contact 64 is arranged in a recess 74 of the electrodes 51 to be galvanically separated from this via contact. This also applies accordingly to the connection of the first electrodes 41 of the input part by means of two via contacts 61 and also to the connection of the first electrodes 51 of the output part by means of two via contacts 63. In the variant according to FIGS. 9A-9B, a via contact is provided for each recess. In the variant according to FIGS. 10A-10B, two via contacts are arranged in a common recess.

Instead of one or two via contacts, at least three via contacts could be provided for connecting the electrodes of the corresponding polarities in all of the embodiments. They could be arranged in a common recess or in separate recesses.

In the variants according to FIGS. 9A, 9B and 10A, 10B, an insulation zone 17 is arranged for galvanic separation between the input part 101 and the output part 102. Here, all of the connection elements 31, 32, 33, 34 are constructed as bumps. Solder connections that are produced using flip-chip technology are called bumps.

The electrodes 41, 42, 51, 52 constructed as internal electrodes could extend up to the side surface of the body 1. However, they could also be set back from the side surface of the body 1. This applies to all of the variants and is especially useful in the variants according to FIGS. 11A-11D, so that the electrodes of one polarity are separated from the outer metallization of the other polarity.

In the variant according to FIGS. 11A, 11B, the first electrodes 41 of the input part are connected to the first outer metallization 810, and the first electrodes 51 of the output part are connected to the third outer metallization 910. The second electrodes 42, 52 of the input part and the output part are connected to the second outer metallization 820 and also the fourth outer metallization 920.

However, it is also possible to construct the implementation shown in FIGS. 11A, 11B with input and output parts galvanically separated from each other in the transformer. In this case, the second electrodes 42 of the input part are connected to the second outer metallization 820 and galvanically separated from the fourth outer metallization 920. The second electrodes 52 of the output part are connected to the fourth outer metallization 920 and galvanically separated from the second outer metallization 820.

The first outer metallization 810 is connected to the first connection face 81, the second outer metallization 820 is connected to the second connection face 82, the third outer metallization 910 is connected to the third connection face 91, and the fourth outer metallization 920 is connected to the fourth connection face 92. In this case, the connection faces 81, 82, 91, 92 are arranged in the edge region of the bottom side of the body and connected to the carrier 2 by a few of the first connection elements 34 constructed as bumps. The second connection elements 32, 33 are connected to the appropriate underlay faces 95. The first connection elements 34 that are not connected to the connection faces 81, 82, 91, 92 are connected to additional underlay faces 96 that have no electrical connection to the input part and output part of the transformer.

Figure 12:
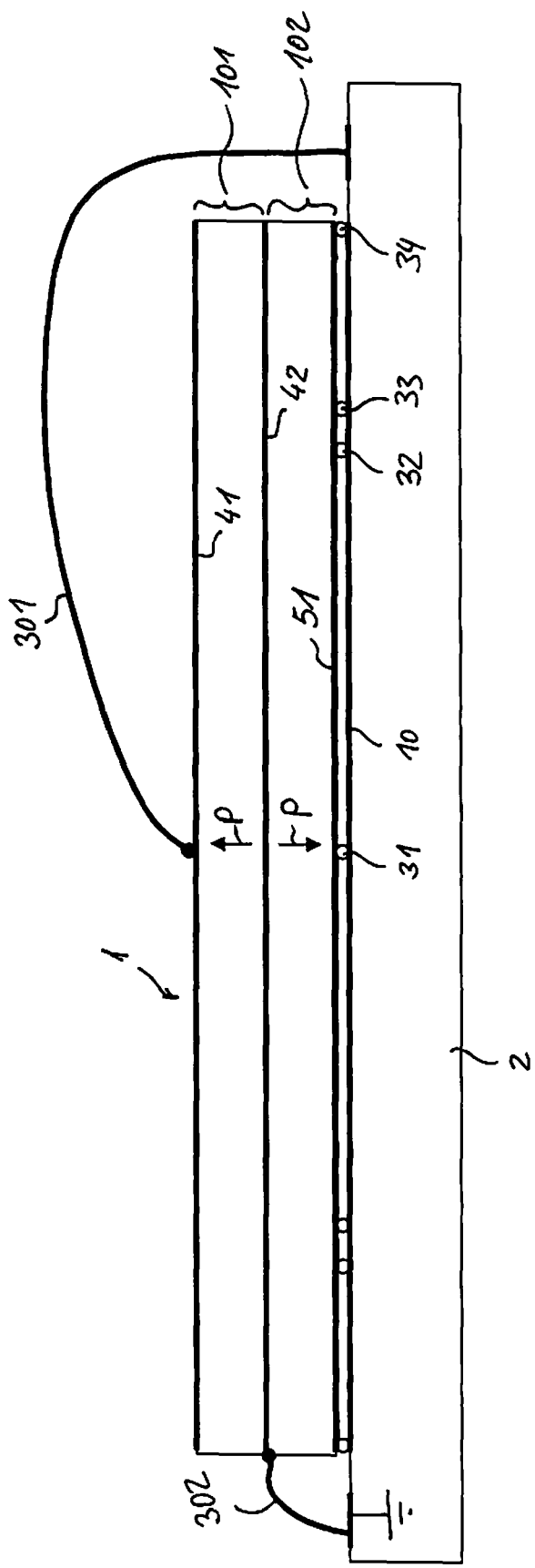
FIG. 12, shows in cross section, a transformer arrangement with a piezoelectric transformer in which one electrode is provided for each polarity.

In FIG. 12, another transformer arrangement with a piezoelectric transformer is shown. The input part 101 has a first electrode 41 that is arranged on the top side of the body. The output part 102 has a first electrode 51 that is arranged on the bottom side of the body. The input part and the output part have a common ground electrode 42.

The electrode 41 is conductively connected to a first contact face of the carrier 2 by means of a wire 301. The electrode 51 is conductively connected to a second contact face of the carrier 2 by means of bumps 31, 32, 33, 34. The common ground electrode 42 is conductively connected to a third contact face of the carrier 2 by means of a wire 302.

The lower electrode of the transformer is preferably passivated up to the regions that are provided for electrical contacting and that are arranged above the bumps. The second contact face 10 of the carrier 2 is preferably also passivated in a corresponding way. The second contact face could also be connected to a connection face of the transformer by means of only one bump 31 or a few of the bumps 31, 32, 33, 34. For the bumps 31, 32, 33, 34, contact faces that are separated as in the preceding variants could also be provided.

Arrows P indicate the direction of polarization of the corresponding piezoelectric layer of the transformer.

The disclosed transformer arrangement is not limited to the embodiments explained in the figures, particularly, to the shape and number of the illustrated elements. The material dimensions are given only as examples. Arbitrary underlay faces for the bumps could also be used as connection faces of the transformer.

The embodiments are not limited to a disk-shaped body. The body could also have a polygonal cross section. The body could have the shape of a board or, preferably, that of a flat, right parallelepiped.

What is claimed is:

1. A transformer arrangement comprising:
   a carrier; and
   a piezoelectric transformer with a body in the form of a board;
   wherein the transformer operates with thickness mode vibrations, and
   wherein the body is rigidly connected to the carrier in at least one peripheral region in which anti-nodes of a horizontal oscillation of the body appear, wherein the rigid connection damps the horizontal oscillation.

2. A transformer arrangement comprising:
   a carrier; and
   a piezoelectric transformer with a body in the form of a board;
   wherein the transformer operates with thickness mode vibrations,
   wherein the body is rigidly connected to the carrier in at least one peripheral region in which anti-nodes of a horizontal oscillation of the body appear, and
   wherein the transformer arrangement further comprises first connection elements, wherein at least one peripheral edge region of a primary face of the body facing the carrier is rigidly connected to the carrier by means of the first connection elements.

3. The transformer arrangement according to claim 2, wherein the first connection elements are spaced apart from each other in a peripheral direction.

4. The transformer arrangement according to claim 2,
   wherein at least one peripheral edge region borders an edge of the body, and
   wherein the at least one peripheral edge region has a width that equals a maximum of 0.5 mm.

5. The transformer arrangement according to claim 2, further comprising second connection elements, wherein the body is rigidly connected to the carrier by means of the second connection elements in at least one other peripheral region of the primary face, wherein this one other peripheral region is spaced apart from an edge of the body and the anti-nodes of the horizontal oscillation appear in this at least one other peripheral region.

6. The transformer arrangement according to claim 5, wherein the second connection elements are spaced apart from each other in a peripheral direction.

7. The transformer arrangement according to claim 5, wherein one or more peripheral regions of the primary face have a width that equals a maximum of 0.5 mm.

8. The transformer arrangement according to claim 5, wherein an additional peripheral region that is arranged between an edge region and a peripheral region of the primary face with the connection elements is free of connection elements.

9. The transformer arrangement according to claim 1, wherein a middle region of a primary face of the body facing the carrier is rigidly connected to the carrier by at least one third connection element.

10. The transformer arrangement according to claim 9, wherein the middle region of the primary face has a linear cross-sectional size that equals a maximum of 0.5 mm.

11. The transformer arrangement according to claim 9, wherein an additional peripheral region that is arranged between the middle region and the peripheral region of the primary face with the at least one third connection element is free of connection elements.

12. The transformer arrangement according to claim 1, wherein the body is connected to carrier at a plurality of connection regions, each connection region have a face with a surface area, wherein a sum of the surface areas of the faces of the connection regions between the carrier and the body equals a maximum of 10% of a surface area of a primary face of the body.

13. The transformer arrangement according to claim 5,
    wherein at least eight first connection elements are provided, and
    wherein at least four second connection elements are provided.

14. The transformer arrangement according to claim 1, wherein the piezoelectric transformer has an input part and an output part that are arranged one above the other.

15. The transformer arrangement according to claim 14, wherein the input part and the output part have electrodes that extend parallel to a primary face of the board.

16. The transformer arrangement according to claim 14,
    wherein the input part has electrodes of first and second polarity in an alternating arrangement, and
    wherein the output part has electrodes of third and fourth polarity in an alternating arrangement.

17. The transformer arrangement according to claim 14, wherein the input part and the output part are connected to a common ground.

18. The transformer arrangement according to claim 2, wherein at least one of the first connection elements is formed by a solder connection.

19. The transformer arrangement according to claim 18, wherein the solder connection connects one connection face of the transformer to one electrical contact face of the carrier.

20. The transformer arrangement according to claim 16, wherein the electrodes of corresponding polarity are conductively connected to each other and to a corresponding connection face by at least one via contact arranged in the body.

21. The transformer arrangement according to claim 16, wherein the electrodes of corresponding polarity are conductively connected to each other and to a corresponding connection face by at least one outer metallization arranged on a surface of the body.

22. The transformer arrangement according to claim 14, further comprising an insulation region arranged between the input part and the output part.

23. The transformer arrangement according to claim 14, wherein the input part and the output part each have at least one internal electrode arranged in the body.

24. The transformer arrangement according to claim 5, wherein the rigid connection damps the horizontal oscillation.

* * * * *